United States Patent

Lee et al.

[11] Patent Number: 6,137,683
[45] Date of Patent: Oct. 24, 2000

[54] HEAT-DISSIPATING DEVICE FOR AN ELECTRONIC COMPONENT

[75] Inventors: Chuan-Yuan Lee; Hui-Lian Chang; Ming Yuan, all of Taipei, Taiwan

[73] Assignee: Compal Electronics, Inc., Taipei, Taiwan

[21] Appl. No.: 09/410,037

[22] Filed: Oct. 1, 1999

[51] Int. Cl.[7] .................................................. H05K 7/20
[52] U.S. Cl. ........................ 361/704; 361/687; 361/695; 165/86; 165/185; 174/16.3; 257/719
[58] Field of Search ..................................... 361/683, 685, 361/687, 689, 690–695, 699, 702–710, 717, 719, 720; 165/80.2, 80.3, 80.4, 86, 104.32, 104.33, 104.24, 104.36, 185, 104.26; 174/15.2, 16.3; 62/259.2; 364/708.1; 16/223, 342; 257/706–727

[56] References Cited

U.S. PATENT DOCUMENTS

| | | | |
|---|---|---|---|
| 5,588,483 | 12/1996 | Ishida | 165/86 |
| 5,781,409 | 7/1998 | Mecredy | 361/687 |
| 5,796,581 | 8/1998 | Mok | 361/687 |
| 5,822,187 | 10/1998 | Garner et al. | 361/687 |
| 5,835,348 | 11/1998 | Ishida | 361/699 |
| 5,975,195 | 11/1999 | Lowry et al. | 165/86 |

*Primary Examiner*—Leo P. Picard
*Assistant Examiner*—Michael Datskovsky
*Attorney, Agent, or Firm*—Pillsbury Madison & Sutro LLP

[57] ABSTRACT

A heat-dissipating device is adapted for dissipating heat generated by a heat-producing electronic component inside an equipment housing. The heat-dissipating device includes a heat transfer plate, a heat exchanger pipe and a heat sink. The heat transfer plate is adapted to be mounted detachably on a heat-releasing side of the electronic component. The heat exchanger pipe has a heat exchanging coolant contained therein, a rear end portion connected to the heat transfer plate, and a front end portion. The heat sink has a first end and a second end opposite to the first end. The second end is coupled non-rotatably to the front end portion of the heat exchanger pipe. The assembly of the heat sink and the heat exchanger pipe is supported inside the housing such that the assembly of the heat sink and the heat exchanger pipe is rotatable relative to the housing about a pivot axis that extends between the first and second ends of the heat sink to permit movement of the heat transfer plate toward or away from the electronic component when the heat transfer plate is detached from the electronic component.

12 Claims, 3 Drawing Sheets

6,137,683

HEAT-DISSIPATING DEVICE FOR AN ELECTRONIC COMPONENT

BACKGROUND OF THE INVENTION

1. Field of the Invention

The invention relates to a heat-dissipating device, more particularly to a rotatable heat-dissipating device for an electronic component.

2. Description of the Related Art

FIG. 1 illustrates a conventional heat-dissipating device for dissipating heat generated by a CPU 10 inside a computer housing 12. The conventional heat-dissipating device includes a heat transfer plate 1, a heat exchanger pipe 2, a heat sink 3 and a fan 4. The CPU 10 is mounted on a socket 101, that is disposed on a main board 11. The heat transfer plate 1 is mounted detachably on the CPU 10 with the use of screws or known fastening elements. The heat exchanger pipe 2 has a rear end portion 20 connected to the heat transfer plate 1, and a front end portion 22 transverse to the rear end portion 20. The heat sink 3 has a first end and a second end connected to the front end portion 22 of the heat exchanger pipe 2. The fan 4 is mounted on the housing 12 and is connected to the first end of the heat sink 3 by means of screws 41 that pass through the housing 12, the fan 4 and the first end of the heat sink 3.

As shown in FIG. 2, when the CPU 10 and electronic components underlying the heat exchanger pipe 2 are to be replaced or repaired, the fan 4 is detached from the housing 12, and the heat transfer plate 1 is detached from the CPU 10, thereby leading to inconvenience during replacing and repairing. Furthermore, the design and the installing position of the conventional heat-dissipating device must be modified to prevent interference with other electronic components, thereby leading to poor heat dissipation.

SUMMARY OF THE INVENTION

Therefore, the object of the present invention is to provide a heat-dissipating device that can overcome the aforesaid drawbacks commonly associated with the prior art.

According to the present invention, a heat-dissipating device is adapted for dissipating heat generated by a heat-producing electronic component inside an equipment housing. The heat-dissipating device includes a heat transfer plate, a heat exchanger pipe, a heat sink and mounting means.

The heat transfer plate is adapted to be mounted detachably on a heat-releasing side of the electronic component.

The heat exchanger pipe has a heat exchanging coolant contained therein, a rear end portion connected to the heat transfer plate, and a front end portion.

The heat sink has a first end and a second end opposite to the first end. The second end is coupled non-rotatably to the front end portion of the heat exchanger pipe.

The mounting means is adapted for supporting assembly of the heat sink and the heat exchanger pipe inside the housing such that the assembly of the heat sink and the heat exchanger pipe is rotatable relative to the housing about a pivot axis that extends between the first and second ends of the heat sink to permit movement of the heat transfer plate toward or away from the electronic component when the heat transfer plate is detached from the electronic component.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
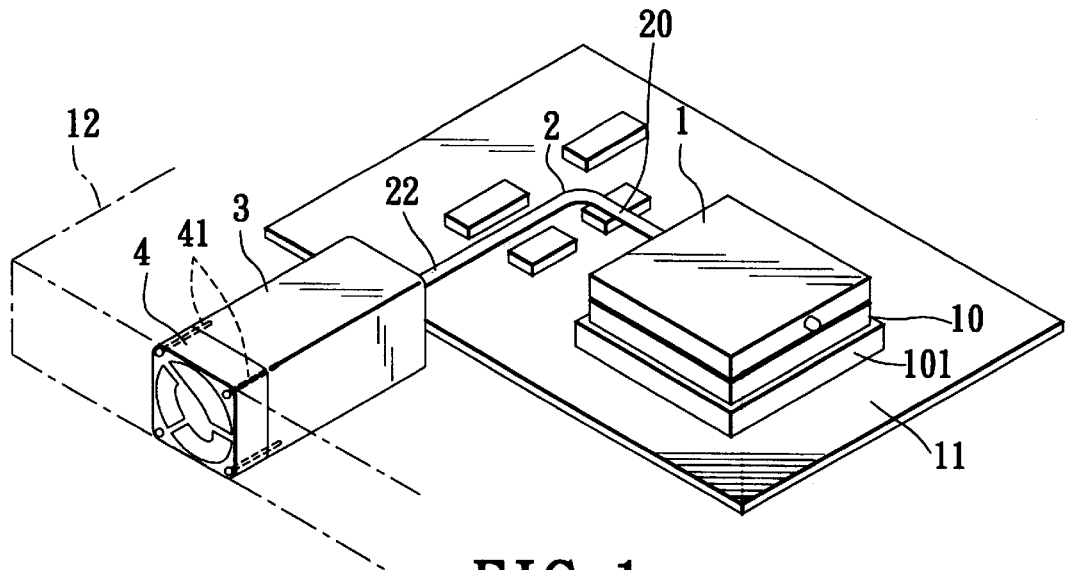
FIG. 1 is a perspective view showing a conventional heat-dissipating device installed on a CPU.
Figure 2:
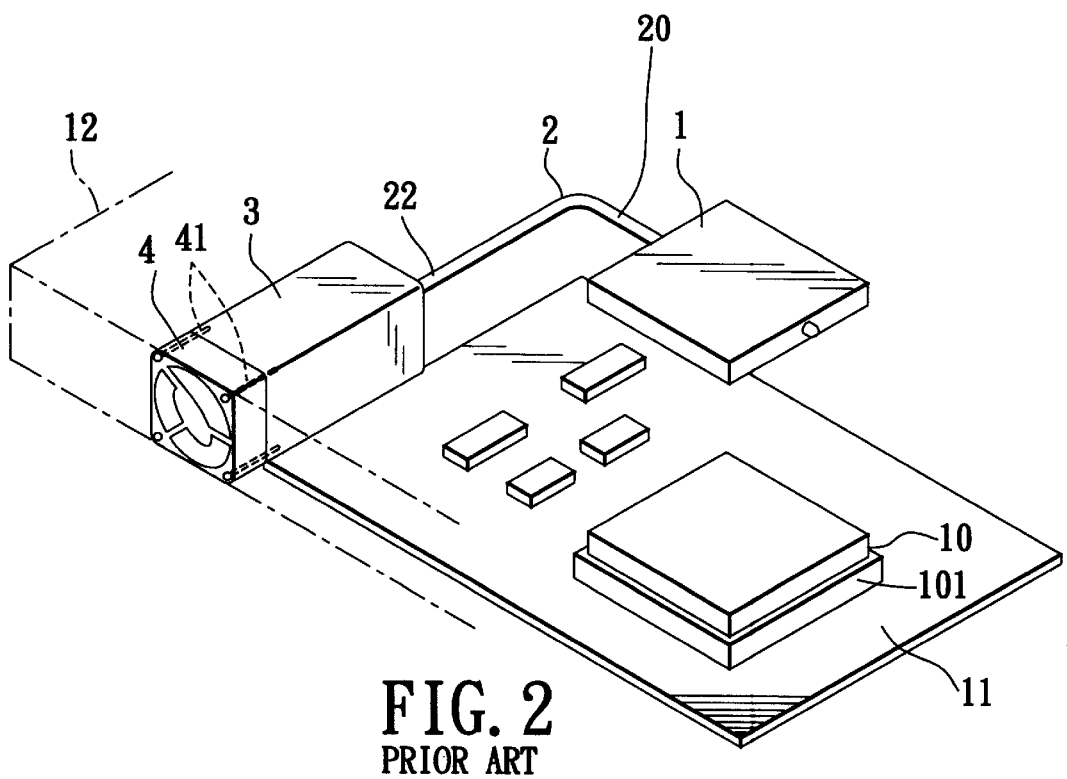
FIG. 2 is a perspective view showing the conventional heat-dissipating device when detached from the CPU.

Before the present invention is described in greater detail, it should be noted that like elements are denoted by the same reference numerals throughout the disclosure.

Figure 3:
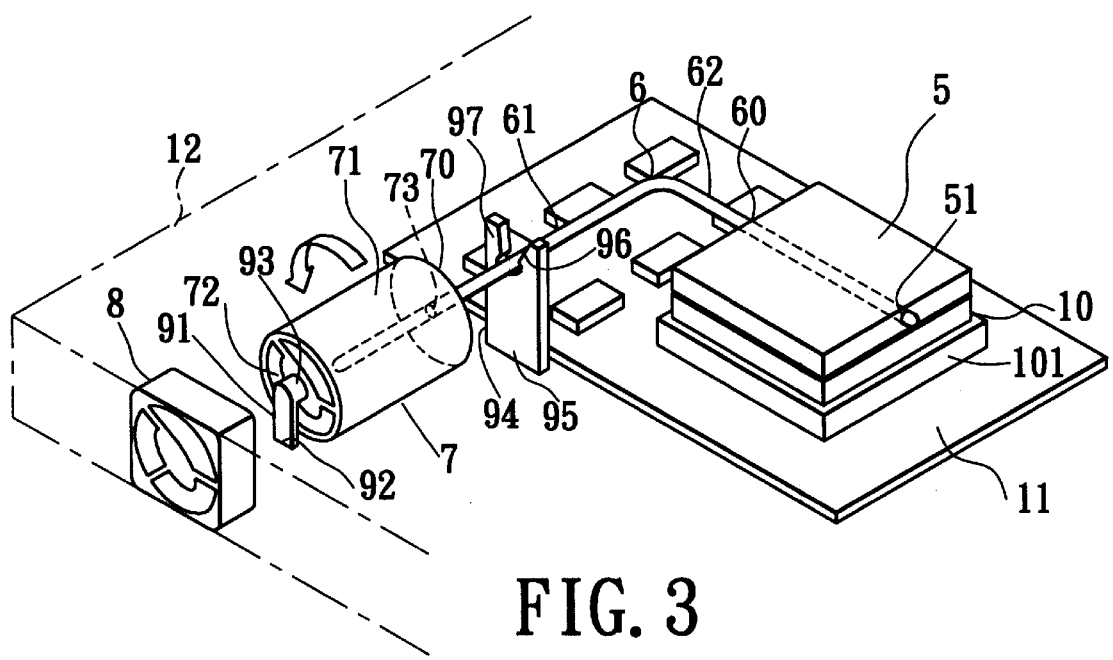
FIG. 3 is a perspective view showing the preferred embodiment of a heat-dissipating device installed on a CPU in accordance with the present invention.
Figure 4:
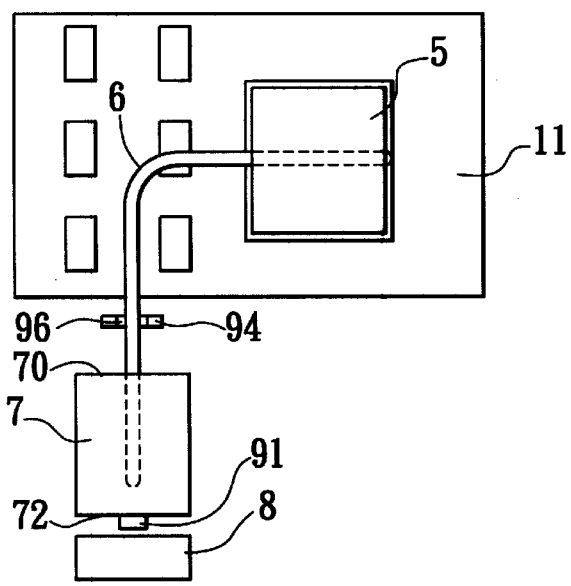
FIG. 4 is a top view of FIG. 3.

Referring to FIGS. 3 and 4, according to the preferred embodiment of the present invention, a heat-dissipating device is adapted for dissipating heat generated by a CPU 10, which serves as a heat-producing electronic component. The CPU 10 is mounted on a socket 101 disposed on a main board 11 inside a computer housing 12. The heat-dissipating device includes a heat transfer plate 5, a heat exchanger pipe 6, a heat sink 7 and a fan 8.

The heat transfer plate 5 is adapted to be mounted detachably on a heat-releasing side of the CPU 10 in a known manner.

The heat exchanger pipe 6 has a heat exchanging coolant contained therein, a rear end portion 62, and a front end portion 61 transverse to the rear end portion 62. The rear end portion 62 is connected to the heat transfer plate 5. Preferably, the heat transfer plate 5 is formed with an insert hole 51 for engaging the rear end portion 62.

The heat sink 7 has a first end 72 and a second end 70 opposite to the first end 72. The second end 70 is coupled non-rotatably to the front end portion 61 of the heat exchanger pipe 6. Preferably, the front end portion 61 of the heat exchanger pipe 6 engages non-rotatably an insert hole 73 formed in the second end 70 of the heat sink 7. The heat sink 7 includes a tubular body 71 having a circular cross-section.

The mounting means includes a support post 91 and a support frame 94. The support post 91 has a lower end 92 adapted to be mounted to the housing 12, and an upper end 93 connected pivotally to the first end 72 of the heat sink 7 at a pivot axis that extends between the first and second ends 72, 70 of the head sink 7. The front end portion 61 of the heat exchanger pipe 6 is aligned with the pivot axis. The support frame 94 has a lower end 95 adapted to be mounted to the housing 12, and an upper end 97 with a distal top edge that is formed with a downwardly extending notch 96. The front end portion 61 of the heat exchanger pipe 6 extends through the notch 96, thereby supporting rotatably the assembly of the heat sink 7 and the heat exchanger pipe 6 inside the housing 12. Therefore, the mounting means is adapted for supporting the assembly of the heat sink 7 and the heat exchanger pipe 6 inside the housing 12 such that the assembly of the heat sink 7 and the heat exchanger pipe 6 is rotatable relative to the housing 12 about the pivot axis to permit movement of the heat transfer plate 5 toward or away from the CPU 10 when the heat transfer plate 5 is detached from the CPU 10.

The fan 8, which is adapted to be mounted on the housing 12, is disposed adjacent to the first end 72 of the heat sink 7 and is aligned with the heat sink 7 about the pivot axis. The fan 8 is spaced apart from the first end 72 of the heat sink 7 along the pivot axis such that the assembly of the heat sink 7 and the heat exchanger pipe 6 is further rotatable relative to the fan 8.

Figure 5:
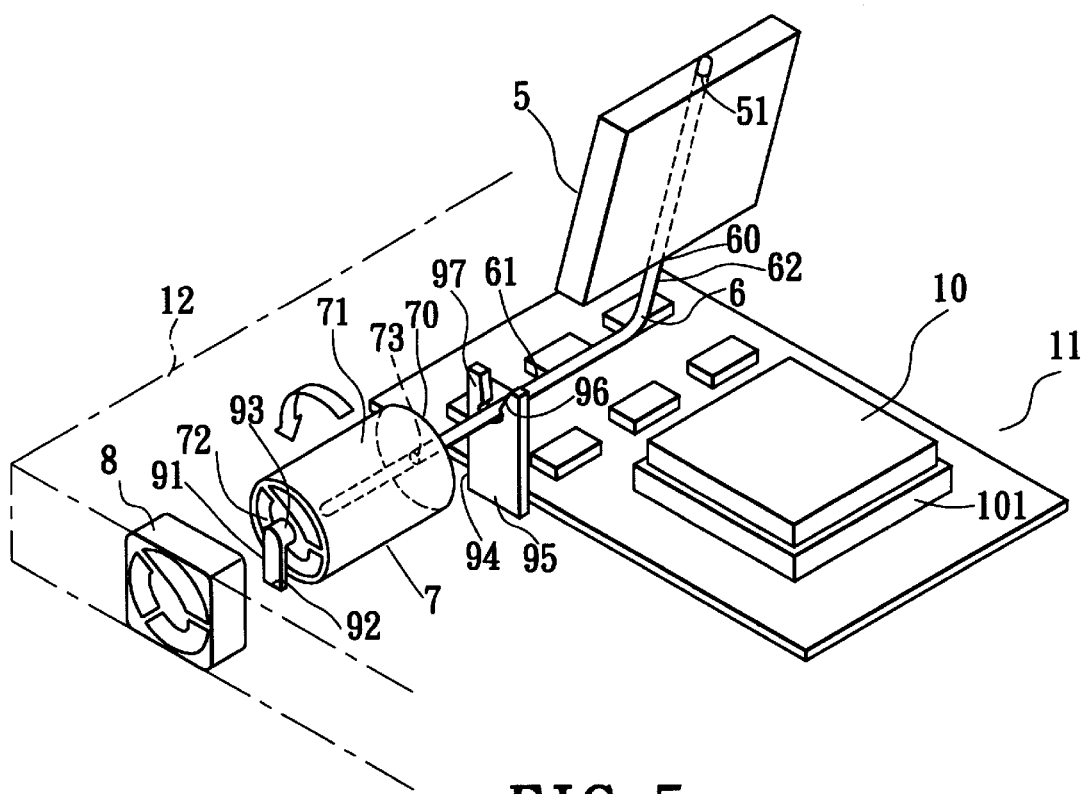
FIG. 5 is a perspective view showing a heat transfer plate of the heat-dissipating device when moved away from the CPU.

When the tubular body 71 of the head sink 7 is rotated about the pivot axis so as to move the heat transfer plate 5 away from the CPU 10, as shown in FIG. 5, the exposed CPU 10 and the underlying electronic components can be easily replaced or repaired. The object of the invention is thus met.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A heat-dissipating device adapted for dissipating heat generated by a heat-producing electronic component inside an equipment housing, comprising:

a heat transfer plate adapted to be mounted detachably on a heat-releasing side of the electronic component;

a heat exchanger pipe with a heat exchanging coolant contained therein, said heat exchanger pipe having a rear end portion connected to said heat transfer plate, and a front end portion;

a heat sink having a first end and a second end opposite to said first end, said second end being coupled non-rotatably to said front end portion of said heat exchanger pipe; and mounting means adapted for supporting assembly of said heat sink and said heat exchanger pipe inside the housing such that the assembly of said heat sink and said heat exchanger pipe is rotatable relative to the housing about a pivot axis that extends between said first and second ends of said heat sink to permit movement of said heat transfer plate toward or away from the electronic component when said heat transfer plate is detached from the electronic component.

2. The heat-dissipating device as claimed in claim 1, further comprising a fan adapted to be mounted on the housing.

3. The heat-dissipating device as claimed in claim 2, wherein said fan is disposed adjacent to said first end of said heat sink and is aligned with said heat sink about the pivot axis.

4. The heat-dissipating device as claimed in claim 3, wherein said fan is spaced apart from said first end of said heat sink along the pivot axis such that the assembly of said heat sink and said heat exchanger pipe is further rotatable relative to said fan.

5. The heat-dissipating device as claimed in claim 1, wherein said heat sink includes a tubular body.

6. The heat-dissipating device as claimed in claim 5, wherein said tubular body has a circular cross-section.

7. The heat-dissipating device as claimed in claim 1, wherein said heat transfer plate is formed with an insert hole for engaging said rear end portion of said heat exchanger pipe.

8. The heat-dissipating device as claimed in claim 1, wherein said heat sink is formed with an insert hole for engaging non-rotatably said front end portion of said heat exchanger pipe.

9. The heat-dissipating device as claimed in claim 1, wherein said front end portion of said heat exchanger pipe is generally transverse to said rear end portion.

10. The heat-dissipating device as claimed in claim 1, wherein said front end portion of said heat exchanger pipe is aligned with the pivot axis.

11. The heat-dissipating device as claimed in claim 1, wherein said mounting means includes a support post having a lower end adapted to be mounted to the housing, and an upper end connected pivotally to said first end of said heat sink at the pivot axis.

12. The heat-dissipating device as claimed in claim 1, wherein said mounting means includes a support frame having a lower end adapted to be mounted to the housing, and an upper end with a distal top edge that is formed with a downwardly extending notch, said front end portion of said heat exchanger pipe extending through said notch, thereby supporting rotatably the assembly of said heat sink and said heat exchanger pipe inside the housing.

* * * * *